(12) United States Patent
Yan et al.

(10) Patent No.: US 10,230,383 B2
(45) Date of Patent: Mar. 12, 2019

(54) TIME-TO-DIGITAL CONVERTER AND DIGITAL PHASE LOCKED LOOP

(71) Applicant: HUAWEI TECHNOLOGIES CO., LTD., Shenzhen, Guangdong (CN)

(72) Inventors: Hao Yan, Shanghai (CN); Jiale Huang, Mougins (FR); Lei Lu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/685,447

(22) Filed: Aug. 24, 2017

(65) Prior Publication Data

US 2017/0373698 A1 Dec. 28, 2017

Related U.S. Application Data

(63) Continuation of application No. PCT/CN2016/082334, filed on May 17, 2016.

(51) Int. Cl.
| | |
|---|---|
| *H03M 1/50* | (2006.01) |
| *H03M 1/00* | (2006.01) |
| *G04F 10/00* | (2006.01) |
| *H03L 7/081* | (2006.01) |

(52) U.S. Cl.
CPC .......... *H03M 1/002* (2013.01); *G04F 10/005* (2013.01); *H03L 7/0814* (2013.01); *H03M 1/502* (2013.01)

(58) Field of Classification Search
CPC ..... H03M 1/002; G04F 10/005; H03L 7/0814
See application file for complete search history.

(56) References Cited

U.S. PATENT DOCUMENTS

| | | | |
|---|---|---|---|
| 5,886,660 A | 3/1999 | Loewenstein | |
| 8,305,248 B2 | 11/2012 | Lee et al. | |
| 8,390,349 B1 * | 3/2013 | Ravi | G04F 10/005 327/147 |

(Continued)

FOREIGN PATENT DOCUMENTS

| | | |
|---|---|---|
| CN | 103957005 A | 7/2014 |
| CN | 103986461 A | 8/2014 |

(Continued)

OTHER PUBLICATIONS

Dudek, P., et al., A High-Resolution CMOS Time-to-Digital Converter Utilizing a Vernier Delay Line. *Institute of Electrical and Electronics Engineers Transactions on Solid-State Circuits*, vol. 35, No. 2, 240-247. Feb. 2000.

(Continued)

*Primary Examiner* — Kenneth B Wells
(74) *Attorney, Agent, or Firm* — Staas & Halsey LLP (57) ABSTRACT

A time-to-digital converter including N stages of converting circuits, where N≥2, and N is an integer. Each stage of converting circuit includes a first delayer and an arbiter; an output end of the first delayer in each stage of converting circuit outputs a delayed signal of the stage of converting circuit; and the arbiter in each stage of converting circuit receives a sampling clock and the delayed signal of the stage of converting circuit, and compares the sampling clock with the delayed signal to obtain an output signal of the stage of converting circuit. Output signals of the N stages of converting circuits form a non-linear binary number, to indicate a time difference between a clock signal and a reference signal.

18 Claims, 3 Drawing Sheets

(56) References Cited

U.S. PATENT DOCUMENTS

| | | | |
|---|---|---|---|
| 2010/0283653 A1* | 11/2010 | Dai | G04F 10/005 341/166 |
| 2010/0295590 A1 | 11/2010 | Yoshihara et al. | |
| 2011/0043693 A1 | 2/2011 | Nakahira et al. | |
| 2011/0064150 A1 | 3/2011 | Uozumi et al. | |
| 2011/0133973 A1 | 6/2011 | Yamamoto et al. | |
| 2011/0140737 A1 | 6/2011 | Rivoir | |
| 2011/0279299 A1 | 11/2011 | Lee et al. | |
| 2011/0304357 A1 | 12/2011 | Tokairin | |
| 2012/0056769 A1* | 3/2012 | Wang | G04F 10/005 341/166 |
| 2012/0069884 A1 | 3/2012 | Sakurai | |
| 2012/0104259 A1 | 5/2012 | Mann | |
| 2014/0055296 A1* | 2/2014 | Miyashita | G06F 1/025 341/166 |
| 2014/0375486 A1* | 12/2014 | Chaivipas | G04F 10/005 341/118 |
| 2015/0205267 A1* | 7/2015 | Hsieh | G04F 10/005 341/166 |
| 2015/0318981 A1 | 11/2015 | Zhou et al. | |
| 2016/0156362 A1* | 6/2016 | Kim | H03L 7/189 327/159 |
| 2016/0204792 A1 | 7/2016 | Kawano | |

FOREIGN PATENT DOCUMENTS

| | | |
|---|---|---|
| CN | 104716955 | 6/2015 |
| CN | 104935344 A | 9/2015 |
| EP | 3249816 | 11/2017 |
| JP | 2009268047 A | 11/2009 |
| JP | 2010273118 A | 12/2010 |
| JP | 2011525737 A | 9/2011 |
| JP | 2011259208 A | 12/2011 |
| JP | 201270087 A | 4/2012 |
| JP | 2012100252 A | 5/2012 |
| JP | 5577232 | 8/2014 |
| JP | 2014236225 A | 12/2014 |
| WO | 2009116296 A1 | 9/2009 |
| WO | 2010013385 A1 | 2/2010 |
| WO | 2010104164 A1 | 9/2010 |

OTHER PUBLICATIONS

Lee, S., et al., *A 1GHz ADPLL with a 1.25ps Minimum-Resolution Sub-Exponent TDC in 0.18μm CMOS. 2010 Institute of Electrical and Electronics Engineers Solid-State Circuits Conference*, Session 26, 482-484. 2010.

International Search Report dated May 17, 2016 in corresponding International Patent Application No. PCT/CN2016/082334.

Priyanka, C. et al, *Design and implementation of time to digital converters*, IEEE Sponsored $2^{nd}$ International Conference on Innovations in Information Embedded and Communication Systems ICIIECS '15, IEEE, Mar. 19, 2015, XP033192387 (4 pp.).

Chung, M. H. et al., *A Time-To-Digital Converter Using Vernier Delay Line with Time Amplification Technique*, IEEE Nuclear Science Symposium and Medical Imaging Conference (NSS/MIC), IEEE, Oct. 23, 2011, XP032121557, pp. 772-775.

Extended European Search Report, dated Apr. 26, 2018, in European Application No. 16856464.9 (13 pp.).

Japanese Office Action dated Jun. 19, 2018 in corresponding Japanese Patent Application No. 2017-520929, 8 pgs.

J. Lin et al, *A PVT tolerant 0.18MHz to 600MHz self-calibrated digital PLL in 90nm CMOS process*. 2004 IEEE International Solid-State Circuits Conference, Sep. 13, 2004, 10 pages.

Notice of Reasons for Rejection for Japanese Application No. 2017-520929 dated Nov. 16, 2018.

\* cited by examiner

TIME-TO-DIGITAL CONVERTER AND DIGITAL PHASE LOCKED LOOP

CROSS-REFERENCE TO RELATED APPLICATIONS

This application is a continuation of International Application No. PCT/CN2016/082334, filed on May 17, 2016, the disclosure of which is hereby incorporated by reference in its entirety.

TECHNICAL FIELD

This application relates to the field of circuit technologies, and in particular, to a time-to-digital converter and a digital phase locked loop.

BACKGROUND

A time-to-digital converter implements conversion from time signals to digital signals by sampling and quantizing time intervals. The time-to-digital converter is widely used in such fields as space exploration, high energy physics, and test equipment, and in recent years, the time-to-digital converter is greatly promoted as a key module in a digital phase locked loop (DPLL).

A structure of a time-to-digital converter in a digital phase locked loop includes a reference clock signal input end and a sampling clock signal input end. After a reference clock signal is input, the reference clock signal passes through multiple stages of same delayers. When a first stage of delayer is passed through, a delayed signal having a delay duration of t is output (t is a degree of precision of the time-to-digital converter), and the delayed signal that is output by the first stage of delayer is input to a second stage of delayer, to obtain a delayed signal having a delay duration of two times of t. By analogy, a delayed signal obtained by an $(i-1)^{th}$ stage of delayer is input to an it stage of delayer, to obtain a delayed signal having a delay duration of i times of t. A sampling clock signal separately samples the series of obtained delayed signals, to obtain a series of output signals. A dynamic range of the time-to-digital converter is t×i, and if t remains unchanged and the time-to-digital converter needs to obtain a large dynamic range, a quantity of stages of delayers needs to be increased. However, an increase in the quantity of stages of delayers directly results in an increase in a quantity of stages of the time-to-digital converter, and the area and power consumption of the time-to-digital converter both increase accordingly.

SUMMARY

This application provides a time-to-digital converter and a digital phase locked loop, to reduce the area and power consumption of a time-to-digital converter while maintaining a dynamic range of the time-to-digital converter.

According to a first aspect, an embodiment of the present invention provides a time-to-digital converter, including N stages of converting circuits connected in series, where N≥2, and N is an integer, each stage of converting circuit includes a first delayer and an arbiter, where a first delayer in a first stage of converting circuit is configured to receive a reference signal, an input end of the first delayer in each stage of convening circuit other than the first stage of convening circuit is coupled to an output end of a first delayer in a previous stage of converting circuit, and an output end of the first delayer in each stage of converting circuit is configured to output a delayed signal of the stage of converting circuit; and the arbiter in each stage of converting circuit is configured to: receive a sampling clock of the stage of converting circuit and the delayed signal of the stage of converting circuit, and compare the sampling clock with the delayed signal to obtain an output signal of the stage of converting circuit, where the sampling clock of each stage of converting circuit is derived from a clock signal; in the N stages of converting circuits, delay times of first delayers in at least two stages of converting circuits are different; and an output signal of the time-to-digital converter is a non-linear binary number formed by output signals of the N stages of converting circuits, where the binary number is used to indicate a time difference between the clock signal and the reference signal. By means of this implementation manner, because delay times of first delayers in at least two stages of converting circuits in N stages of converting circuits are different, non-linearity of output of the time-to-digital converter is ensured, so that in a case of a large dynamic range, a quantity of circuit stages can be effectively reduced, thereby reducing the area and power consumption of a circuit.

With reference to the implementation manner of the first aspect, in a first possible implementation manner of the first aspect, the first delayer in each stage of converting circuit includes at least one first delay cell circuit; and quantities of first delay cell circuits included in first delayers in the at least two stages of converting circuits are different.

With reference to the first aspect or the first possible implementation manner of the first aspect, in a second possible implementation manner of the first aspect, the sampling clock of each stage of converting circuit is the clock signal.

With reference to the implementation manner of the first aspect, in a third possible implementation manner of the first aspect, each stage of converting circuit further includes a second delayer, where a second delayer in the first stage of converting circuit is configured to receive the clock signal, an input end of the second delayer in each stage of converting circuit other than the first stage of converting circuit is coupled to an output end of a second delayer in the previous stage of converting circuit, and an output end of the second delayer in each stage of converting circuit is configured to output the sampling clock of the stage of converting circuit.

With reference to the third possible implementation manner of the first aspect, in a fourth possible implementation manner of the first aspect, a second delay time of the second delayer in each stage of converting circuit is less than a first delay time of the first delayer in the stage of converting circuit.

With reference to the third or the fourth possible implementation manner of the first aspect, in a fifth possible implementation manner of the first aspect, the first delayer in each stage of converting circuit includes at least one first delay cell circuit, and the second delayer in the stage of converting circuit includes at least one second delay cell circuit; a quantity of second delay cell circuits in the second delayer in each stage of converting circuit is equal to a quantity of first delay cell circuits in the first delayer in the stage of converting circuit; and quantities of first delay cell circuits included in first delayers in the at least two stages of converting circuits are different.

With reference to the fifth possible implementation manner of the first aspect, in a sixth possible implementation manner of the first aspect, a third delay time of the second delay cell circuit in the second delayer in each stage of converting circuit is less than a fourth delay time of the first delay cell circuit in the first delayer in the stage of converting circuit.

With reference to any one of the third to the sixth possible implementation manners of the first aspect, in a seventh possible implementation manner of the first aspect, each stage of converting circuit further includes a synchronization flip-flop; and the synchronization flip-flop in each stage of converting circuit is configured to sample an output signal generated in the stage of converting circuit to synchronize the output signals of the N stages of converting circuits.

With reference to any one of the first aspect or the first to the seventh possible implementation manners of the first aspect, in an eighth possible implementation manner of the first aspect, in the N stages of converting circuits, an arbiter in at least one stage of converting circuit is an arbiter or a flip-flop.

With reference to the eighth possible implementation manner of the third aspect, in a ninth possible implementation manner of the third aspect, the flip-flop is a D flip-flop.

With reference to any one of the first aspect or the first to the ninth possible implementation manners of the first aspect, in a tenth possible implementation manner of the first aspect, a delay time of the first delayer in each stage of converting circuit is not less than a delay time of the first delayer in the previous stage of converting circuit.

With reference to the tenth possible implementation manner of the first aspect, in an eleventh possible implementation manner of the first aspect, a delay time of the first delayer in the first stage of converting circuit is a time unit; and a delay time of a first delayer in a $j^{th}$ converting circuit is $2^{j-2}$ time units, where j=2, 3, . . . N.

With reference to any one of the first aspect or the first to the eleventh possible implementation manners of the first aspect, in a twelfth possible implementation manner of the first aspect, the reference signal is another clock signal.

With reference to any one of the first aspect or the first to the twelfth possible implementation manners of the first aspect, in a thirteenth possible implementation manner of the first aspect, the binary number is thermometer code.

According to a second aspect, an embodiment of the present invention further provides a digital phase locked loop, including the time-to-digital converter according to any one of the first aspect or the first to the thirteenth possible implementation manners of the first aspect, where the reference signal is a reference clock signal of the digital phase locked loop, and the clock signal is a frequency division signal of an output signal of the digital phase locked loop.

BRIEF DESCRIPTION OF DRAWINGS

To describe the technical solutions in this application more clearly, the following briefly describes the accompanying drawings required for describing the embodiments. Apparently, a person of ordinary skill in the art may still derive other drawings from these accompanying drawings without creative efforts.

DESCRIPTION OF EMBODIMENTS

Figure 1:
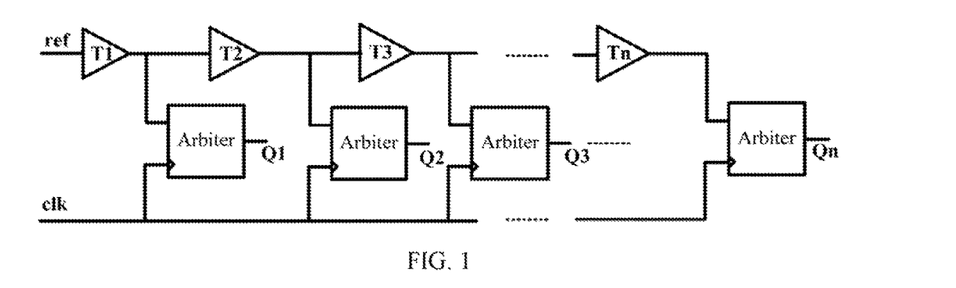
FIG. 1 is a schematic structural diagram of a time-to-digital converter according to an embodiment of the present invention.

Referring to FIG. 1, FIG. 1 is a schematic structural diagram of a time-to-digital converter. As shown in FIG. 1, the time-to-digital converter includes N stages of converting circuits, where N≥2, and N is an integer. A first delayer in a first stage of converting circuit is configured to receive a reference signal ref, an input end of a first delayer in each stage of converting circuit other than the first stage of converting circuit is coupled to an output end of a first delayer in a previous stage of converting circuit, an output end of the first delayer in each stage of converting circuit is configured to output a delayed signal of the stage of converting circuit, and the reference signal may be a clock.

An arbiter in each stage of converting circuit is configured to: receive a sampling clock of the stage of converting circuit and the delayed signal of the stage of converting circuit, and compare the sampling clock with the delayed signal to obtain an output signal of the stage of converting circuit. For example, the arbiter may include a comparator or a flip-flop, configured to compare input signals of a second input end and a third input end. A common form of the flip-flop is a D flip-flop. The sampling clock of each stage of converting circuit is derived from a clock signal clk. The comparator and the flip-flop both can implement a function of comparison.

In the N stages of converting circuits, delay times of N corresponding first delayers are respectively T1, T2, T3 . . . Tn, and delay times of first delayers in at least two stages of converting circuits are different. Output signals Q1 to Qn of the time-to-digital converter are a non-linear binary number formed by output signals of the N stages of converting circuits. The binary number is used to indicate a time difference between the clock signal and the reference signal, and Q1 to Qn may be specifically thermometer code. A degree of indication precision of an output signal corresponding to each stage of converting circuit in the binary number depends on a delay time of the first delayer in the stage of converting circuit.

Figure 2:
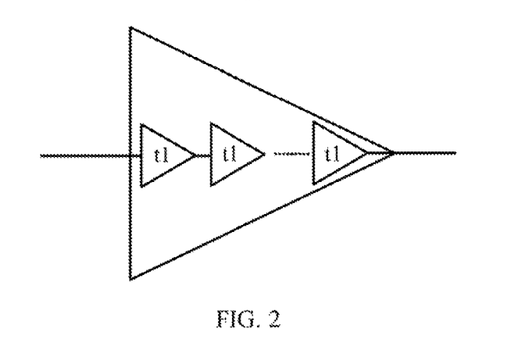
FIG. 2 is a schematic structural diagram of a first delayer according to an embodiment of the present invention.

As shown in FIG. 2, the delayer in the time-to-digital converter is provided with a preset quantity of first delay cell circuits, and delay times t1 of all first delay cell circuit are the same. It is assumed that the delay time t1 of the first delay cell circuit is a time unit. The first delayer in each stage of converting circuit includes at least one first delay cell circuit, and if a same delayer includes multiple first delay cell circuits, the multiple first delay cell circuits are connected in series; and quantities of first delay cell circuits included in first delayers in the at least two stages of converting circuits are different.

For the time-to-digital converter in FIG. 1 of this embodiment, assuming that a time interval between the reference signal ref and the clock signal clk is 1270 ps, the delay time t1 of the first delay cell circuit may be set to 20 ps, a quantity of circuit stages of the time-to-digital converter may be set to 7, and quantities of first delay cell circuits disposed in a series of first delayers corresponding to the first stage to the seventh stage of converting circuits are respectively 1, 1, 2, 4, 8, 16, and 32. Corresponding delays of the series of first delayers are respectively $2^0 t1$, $2^1 t1$, $2^2 t1$, $2^3 t1$, $2^4 t1$, $2^5 t1$, and $2^6 t1$, which implements outputs of code words in the power of 2. In this case, correspondingly-output delayed signals of a series of first clocks are delayed 20 ps, 40 ps, 120 ps . . . 640 ps, and 1280 ps correspondingly. Correspondingly, output digital signals Q1 to Q7 are 1111110. Therefore, it may be determined that a time interval between two clock signals ranges from 640 ps and 1280 ps, that is, 1280 ps−640 ps=640 ps, and time intervals (Tres) corresponding to all code words in Q1 to Q7 are different, so that the outputs of the code words provided in this embodiment are non-linear. For a code word of a higher bit, such as Q7, although compared with a time interval between two clock signals obtained by a conventional time-to-digital converter, there is a greater error in the time interval, that is, a lower degree of precision indicates a larger time interval corresponding to the code word, the area and power consumption of the time-to-digital converter both are reduced compared with those of a commonly-used time-to-digital converter. When the time interval between the two clock signals is relatively short, the time-to-digital converter provided in this embodiment can also ensure precision within a short input interval.

Although the quantity of first delay cell circuits used in the time-to-digital converter in this embodiment is the same as a quantity of delayers in a commonly-used time-to-digital converter, only seven stages of converting circuits are needed, and only seven arbiters are needed correspondingly, so that a quantity of arbiters is reduced, and the area and power consumption of the time-to-digital converter are effectively reduced.

For example, the time interval between the reference signal ref and the clock signal clk is still 1270 ps. Assuming that a degree of precision of a time-to-digital converter is adjusted to 10 ps in this case, for a commonly-used time-to-digital converter, a delay time of each delayer is 10 ps, and 128 stages of converting circuits are needed. It may be known that in this case, 128 arbiters need to be disposed in the time-to-digital converter, and the area and power consumption of the circuit are excessively large correspondingly. If the time-to-digital converter in FIG. 1 of this embodiment is used, because it needs to be ensured that a degree of precision of the time-to-digital converter is 10 ps, the delay time t1 of the delay cell circuit is set to 10 ps, eight stages of converting circuits are disposed in the time-to-digital converter, and quantities of first delay cell circuits disposed in a series of corresponding first delayers are respectively 1, 1, 2, 4, 8, 16, 32, and 64. Corresponding delays of the series of first delayers are respectively $2^0 t1$, $2^1 t1$, $2^2 t1$, $2^3 t1$, $2^4 t1$, $2^5 t1$, $2^6 t1$, and $2^7 t1$. In this case, output digital signals Q1 to Q8 are 11111110, it may be determined that a time interval between two clock signals ranges from 640 ps and 1280 ps, and it may be seen that as the degree of precision of the time-to-digital converter increases, the time-to-digital converter provided in this embodiment can reduce a quantity of circuit stages while ensuring a dynamic range of the time-to-digital converter to a greatest extent, thereby reducing the area and power consumption of the time-to-digital converter.

Although some delayed signals are omitted in the time-to-digital converter provided in the foregoing embodiment, compared with a commonly-used time-to-digital converter, the time-to-digital converter can still determine a time interval between two signals while ensuring a dynamic range of the time-to-digital converter to a greatest extent, and a quantity of stages of the time-to-digital converter and a quantity of delay cell circuits in each delayer can be flexibly set according to a specific time interval between the two signals. Certainly, the quantity of stages of converting circuits of the time-to-digital converter and the quantity of first delay cell circuits in each delayer above are merely set as examples, and may be designed specifically according to an actual case. For example, the quantity of stages of converting circuits may be increased or reduced, and sequentially delayed signals of the reference signal ref may be a square or a cube of a natural number, or another irregular relationship may be used. For example, quantities of first delay cell circuits disposed in a series of first delayers are respectively 1, 3, 5, 7 . . . , and accumulated delays of outputs corresponding to stages are 1, 4, 9, 16 . . . .

It may be seen from the foregoing embodiment that, an embodiment provides a time-to-digital converter, including N stages of converting circuits, where N≥2, and N is an integer. Each stage of converting circuit includes a first delayer and an arbiter. The first delayer in the converting circuit is provided with a preset quantity of first delay cell circuits, and quantities of first delay cell circuits included in first delayers in at least two stages of converting circuits are different. Because the N stages of converting circuits each have a same first delay cell circuit, a stable delay ratio and a precise delay time of each stage of converting circuit are ensured, and the quantity of first delay cell circuits in each first delayer may be preset as required, so that in a case of a large dynamic range, a quantity of circuit stages can be effectively reduced, thereby reducing the area and power consumption of a circuit.

However, a degree of precision of the time-to-digital converter is limited by the first delay cell circuit, and a minimum degree of precision is a delay of one first delay cell circuit.

Figure 3:
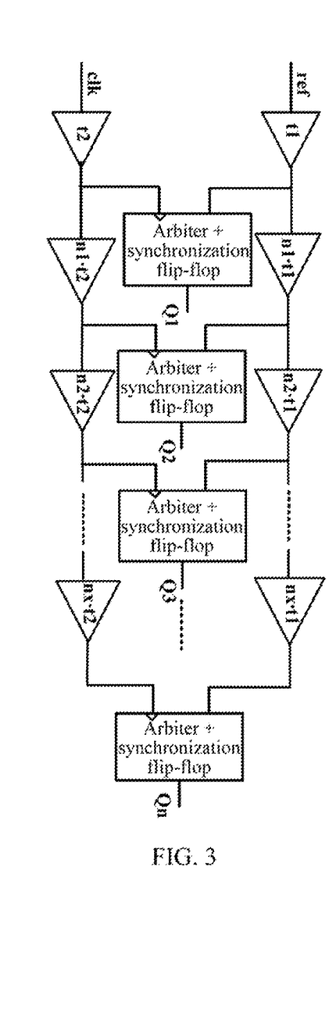
FIG. 3 is a schematic structural diagram of another time-to-digital converter according to an embodiment of the present invention.

Corresponding to the embodiment of the time-to-digital converter provided in the present invention, referring to FIG. 3, FIG. 3 is a schematic structural diagram of another time-to-digital converter according to an embodiment of the present invention. Different from the time-to-digital converter provided in FIG. 1, in this time-to-digital converter, each stage of converting circuit further includes a second delayer. A second delayer in the first stage of converting circuit is configured to receive the clock signal clk, an input end of the second delayer in each stage of converting circuit other than the first stage of converting circuit is coupled to an output end of a second delayer in a previous stage of converting circuit, and an output end of the second delayer in each stage of converting circuit is configured to output a sampling clock of the stage of converting circuit.

The second delayer is provided with a preset quantity of second delay cell circuits, and the second delay cell circuits are connected in series. A second delay time of the second delayer in each stage of converting circuit is less than a first delay time of the first delayer in the stage of converting circuit. A binary number that is output by output signals Q1 to Qn of the time-to-digital converter provided in this embodiment and a degree of indication precision of an output signal corresponding to each stage of converting circuit depend on a difference between a delay time of the first delayer and a delay time of the second delayer in the stage of converting circuit.

Preferably, to ensure that the second delay time of the second delayer in each stage of converting circuit is less than the first delay time of the first delayer in the stage of converting circuit, a quantity of second delay cell circuits is equal to a quantity of first delay cell circuits in a same stage of converting circuit, and it needs to be ensured that a third delay time of the second delay cell circuit is less than a fourth delay time of the first delay cell circuit.

In FIG. 3, t1 is the fourth delay time of the first delay cell circuit, and t2 is the third delay time of the second delay cell circuit. In this embodiment, the first delayer in the first stage of converting circuit is provided with one first delay cell circuit, and a second delayer in the corresponding stage of converting circuit is also provided with one second delay cell circuit. First delayers in remaining N−1 stages of converting circuits are respectively provided with n1, n2 . . . nx first delay cell circuits, and a quantity of second delay cell circuits disposed in a second delayer in a corresponding stage of converting circuit is the same as a quantity of first delay cell circuits disposed in the first delayer in the stage of converting circuit.

Further, different from the time-to-digital converter provided in FIG. 1, in each stage of the time-to-digital converter provided in FIG. 3, a synchronization flip-flop may be added behind the arbiter or flip-flop. Therefore, the arbiter configured to compare two signals in the embodiment corresponding to FIG. 3 may include either one of a comparator or a flip-flop, and the synchronization flip-flop. Each stage of synchronization flip-flop samples output of each stage of arbiter by using a synchronization clock, to ensure synchronization of each stage of output signal. The synchronization flip-flop and the arbiter are similar flip-flops, and may be simple D flip-flops or flip-flops in another architecture. The reason to add the synchronization flip-flop is: In the time-to-digital converter provided in this embodiment, both two clock signals pass through a delayer, resulting in that delayed clock signals are not synchronized in a time domain. Therefore, a unified clock is needed to synchronize each stage of output, and a synchronization clock is provided by an external circuit.

For example, a time interval between two clock signals is still 1270 ps. On a premise that a degree of precision of a time-to-digital converter is 20 ps, a conventional time-to-digital converter needs 64 stages of converting circuits, and the time-to-digital converter provided in FIG. 1 needs only seven stages of converting circuits, but a problem occurs in the time-to-digital converter provided in FIG. 1 is that a minimum degree of precision is a delay time of one first delay cell circuit. In this embodiment, referring to FIG. 4, in the time-to-digital converter provided in this embodiment, based on the time-to-digital converter provided in FIG. 1, a second delay cell circuit is introduced, and that the time-to-digital converter needs only seven stages of converting circuits is also ensured, but a degree of precision of the time-to-digital converter is t1-t2. Theoretically, t1 and t2 may have any values, as long as t1 is greater than t2. Therefore, the time-to-digital converter in this embodiment may obtain more flexible precision. Moreover, because each stage of converting circuit includes same quantities of first delay cell circuits and second delay cell circuits, integral nonlinearity/differential nonlinearity (INL/DNL) of the time-to-digital converter may be ensured.

It may be seen in this embodiment that compared with the time-to-digital converter provided in FIG. 1, a degree of precision is further improved in the time-to-digital converter provided in this embodiment, and a quantity of circuit stages of a time-to-digital converter is reduced whiling ensuring the degree of precision of the time-to-digital converter, thereby reducing the area and power consumption of the time-to-digital converter.

Figure 5:
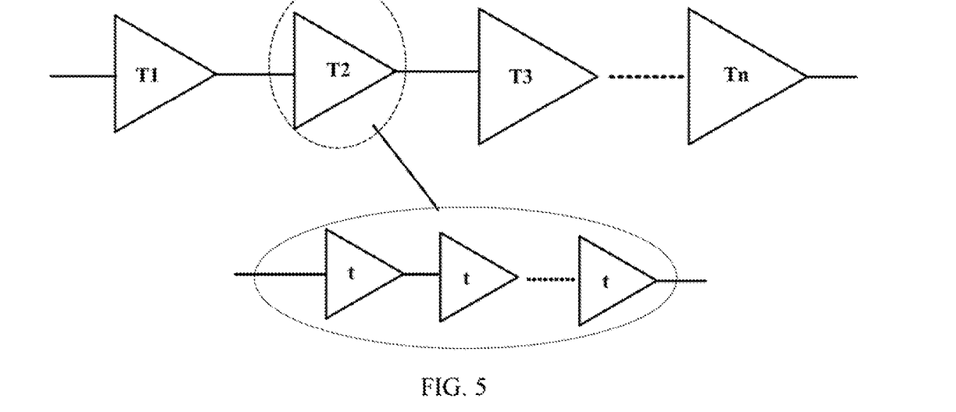
FIG. 5 is a schematic structural diagram of a non-linear output delay chain according to an embodiment of the present invention.

Corresponding to the time-to-digital converter embodiments provided in the foregoing embodiments, the present invention further provides a non-linear output delay chain. Referring to FIG. 5, FIG. 5 is a schematic structural diagram of a non-linear output delay chain. As shown in FIG. 5, the non-linear output delay chain includes N delayers, where N≥2, and N is an integer. The delayer includes an input end and an output end, and an output end of a $(j-1)^{th}$ delayer is connected to an input end of a $j^{th}$ delayer, j=2, 3 . . . N. The delayer is provided with a preset quantity of delay cell circuits, and the delay cell circuits are connected in series.

Referring to an enlarged diagram of a stage of delayer at the bottom of FIG. 5, multiple delay cell circuits are connected in series, and the multiple delay cell circuits form a sub-delay chain in a current delayer. A signal input end of the sub-delay chain is connected to an input end of the current delayer and is configured to receive a signal from the current delayer. After the signal is transmitted to the sub-delay chain by using the input end of the current delayer, the signal is output from a signal output end of the sub-delay chain after a series of delay processing. The signal output end of the sub-delay chain is connected to an output end of the current delayer, the output end of the current delayer receives a delayed signal that is output from the signal output end of the sub-delay chain, and transmits the delayed signal to a next adjacent delayer, and the delayed signal enters the next delayer. Only after an $N^{th}$ delay cell receives a delayed signal that is output from an $(N-1)^{th}$ delay cell, and the delayed signal is output from an output end of an $N^{th}$ delayer after delay processing, delaying of the current signal ends. The processing on the signal is the same as the foregoing process, and details are not described herein again.

Figure 4:
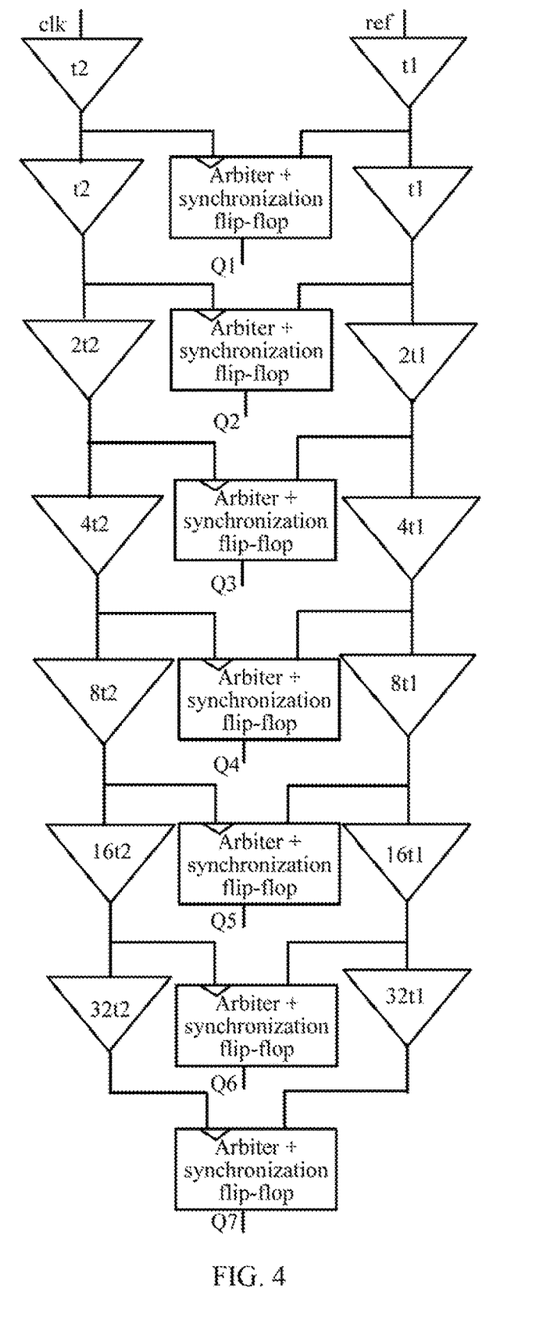
FIG. 4 is a schematic structural diagram of a time-to-digital converter with seven stages of converting circuits according to an embodiment of the present invention.
Figure 6:
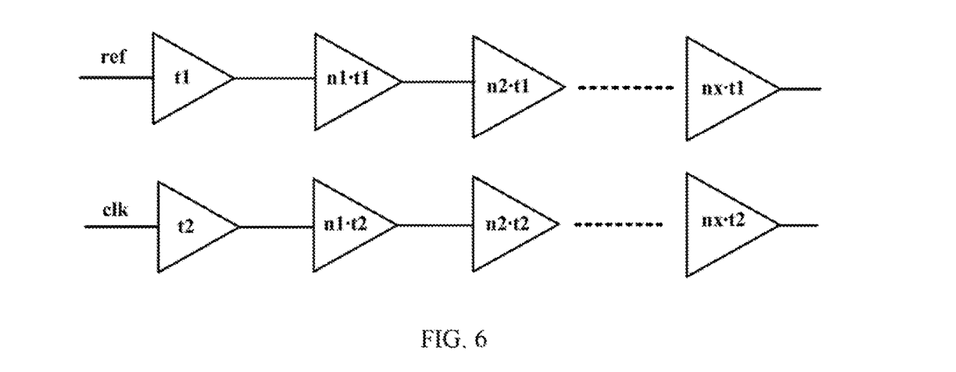
FIG. 6 is a schematic structural diagram of two different non-linear output delay chains according to an embodiment of the present invention.

The time-to-digital converter provided in FIG. 3 and FIG. 4 of this embodiment includes at least two types of non-linear output delay chains. Referring to FIG. 6, FIG. 6 shows a non-linear output delay chain that includes a first delay cell circuit and a non-linear output delay chain that includes a second delay cell circuit. The only difference between the two types of non-linear output delay chains is that delay cell circuits disposed in delayers are different. Corresponding to the time-to-digital converter provided in FIG. 4, in a same stage of converting circuit, a quantity of first delay cell circuits is the same as a quantity of second delay cell circuits. A fourth delay time t1 of the first delay cell circuit is greater than a third delay time 12 of the second delay cell circuit. Preferably, a difference t1-t2 between the fourth delay time t1 of the first delay cell circuit and the third delay time t2 of the second delay cell circuit is relatively small. In this way, when the first delay cell circuit and the second delay cell circuit are applied to the time-to-digital converter shown in FIG. 4 and FIG. 5, as the time difference between the first delay cell circuit and the second delay cell circuit is smaller, a degree of precision of the time-to-digital converter is higher. Therefore, a quantity of circuit stages of the time-to-digital converter is reduced while ensuring a high degree of precision of the time-to-digital converter, and the area and power consumption of the time-to-digital converter both are reduced correspondingly. Certainly, the non-linear output delay chain is not limited to the two types, a non-linear delay chain required in an actual case may be obtained by changing a quantity of delay cells included in the non-linear output delay chain and using delay cell circuits with different delay times, and a specific example is not enumerated.

Figure 7:
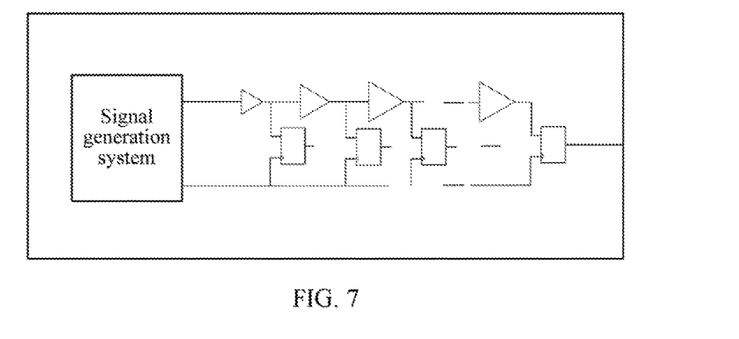
FIG. 7 is a schematic structural diagram of a device according to an embodiment of the present invention.

The present invention further provides an embodiment of a device. Referring to FIG. 7, FIG. 7 is a schematic structural diagram of a device. As shown in FIG. 7, the device includes a signal generation system and a time-to-digital converter, and the signal generation system is connected to the time-to-digital converter. The signal generation system is configured to generate two signals and output the two signals by using output ends of the signal generation system. The two signal output ends are respectively connected to two signal input ends of the time-to-digital converter. The time-to-digital converter disposed in the device includes N stages of converting circuits, where N≥2, and N is an integer. The time-to-digital converter may be any time-to-digital converter provided in FIG. 1 or FIG. 3. After two clock signals generated by the signal generation system are input to the time-to-digital converter, a time interval between the two signals may be obtained according to code words output by the time-to-digital converter.

The time-to-digital converter or the device provided in this embodiment may be applied to various application scenarios with a digital phase locked loop included. The reference signal is a reference clock signal of the digital phase locked loop, and the clock signal is a frequency division signal of an output signal of the digital phase locked loop. The digital phase locked loop compares the reference clock signal with the frequency division signal by using the time-to-digital converter to ensure locking. For example, under the action of the digital phase locked loop including the time-to-digital converter, a time interval between two input signals of the time-to-digital converter continues to decrease, and when the digital phase locked loop is locked, the time interval between the two input signals is within 1 LSB (least significant bit). Therefore, for the time-to-digital converter, when an input time interval is relatively large, as long as code words that are output by the time-to-digital converter can correctly lead an adjustment direction of the digital phase locked loop, the loop can be normally locked, and the time-to-digital converter does not need to provide linear output code words. Therefore, the time-to-digital converter provided in this embodiment can be well applied to a digital phase locked loop, and does not affect system operation.

Same or similar parts of each embodiment in this specification may be cross-referenced, and each embodiment emphatically describes a difference from the other embodiments. Relational terms such as "first" and "second" are only used to distinguish one entity or operation from another, and do not necessarily require or imply that any actual relationship or sequence exists between these entities or operations. Moreover, "connection" involved in the embodiments of the present invention should be understood as a communication connection or an electrical connection, which not only includes a direct connection by using a conducting wire or a data line, but also includes an indirect connection by using other elements, and of which meaning is similar to coupling or a coupled connection. The foregoing descriptions are implementation manners of the present invention, but are not intended to limit the protection scope of the present invention.

What is claimed is:

1. A time-to-digital converter, comprising:
N stages of converting circuits connected in series, wherein N≥3, and N is an integer;
each stage of the N stages of converting circuits includes a first delayer and an arbiter, wherein
a first delayer in a first stage of the N stages of converting circuits is configured to receive a reference signal, an input end of the first delayer in each stage of the N stages of converting circuits other than the first stage of the N stages of converting circuits is coupled to an output end of a first delayer in a previous stage of the N stages of converting circuits, and an output end of the first delayer in each stage of the N stages of converting circuits is configured to output a delayed signal of the stage of the N stages of converting circuits; and
the arbiter in each stage of the N stages of converting circuits is configured to: receive a sampling clock of the stage of the N stages of converting circuits and the delayed signal of the stage of the N stages of converting circuits, and compare the sampling clock with the delayed signal to obtain an output signal of the stage of the N stages of converting circuits, wherein the sampling clock of each stage of the N stages of converting circuits is derived from a clock signal; and
in the N stages of converting circuits connected in series, a delay time of the first delayer in the first stage of the N stages of converting circuits is designed to be different than a delay time of a first delayer in at least one other stage of the N stages of converting circuits; and
an output signal of the time-to-digital converter is a non-linear binary number formed by output signals of the N stages of the N stages of converting circuits, wherein the binary number is used to indicate a time difference between the clock signal and the reference signal, wherein
a delay time of the first delayer in the first stage of the N stages of converting circuits is a time unit, and
a delay time of a first delayer in a $j^{th}$ converting circuit is $2^{j-2}$ time units, wherein j=3...N.

2. The time-to-digital converter according to claim 1, wherein the first delayer in each stage of the N stages of converting circuits comprises at least one first delay cell circuit; and quantities of first delay cell circuits comprised in first delayers in the at least two stages of the N stages of converting circuits are different.

3. The time-to-digital converter according to claim 1, wherein the sampling clock of each stage of the N stages of converting circuits is the clock signal.

4. The time-to-digital converter according to claim 1, wherein each stage of the N stages of converting circuits further comprises a second delayer, wherein
a second delayer in the first stage of the N stages of converting circuits is configured to receive the clock signal, an input end of the second delayer in each stage of the N stages of converting circuits other than the first stage of the N stages of converting circuits is coupled to an output end of a second delayer in the previous stage of the N stages of converting circuits, and an output end of the second delayer in each stage of the N stages of converting circuits is configured to output the sampling clock of the stage of the N stages of converting circuits.

5. The time-to-digital converter according to claim 4, wherein a second delay time of the second delayer in each stage of the N stages of converting circuits is less than a first delay time of the first delayer in the stage of the N stages of converting circuits.

6. The time-to-digital converter according to claim 4, wherein the first delayer in each stage of the N stages of converting circuits comprises at least one first delay cell circuit, and the second delayer in the stage of the N stages of converting circuits comprises at least one second delay cell circuit;
a quantity of second delay cell circuits in the second delayer in each stage of the N stages of converting circuits is equal to a quantity of first delay cell circuits in the first delayer in the stage of the N stages of converting circuits; and quantities of first delay cell circuits comprised in first delayers in the at least two stages of the N stages of converting circuits are different.

7. The time-to-digital converter according to claim 6, wherein a third delay time of the second delay cell circuit in the second delayer in each stage of the N stages of converting circuits is less than a fourth delay time of the first delay cell circuit in the first delayer in the stage of the N stages of converting circuits.

8. The time-to-digital converter according to claim 4, wherein each stage of the N stages of converting circuits further comprises a synchronization flip-flop; and the synchronization flip-flop in each stage of the N stages of converting circuits is configured to sample an output signal generated in the stage of the N stages of converting circuits to synchronize the output signals of the N stages of the N stages of converting circuits.

9. The time-to-digital converter according to claim 1, wherein in the N stages of the N stages of converting circuits, an arbiter in at least one stage of the N stages of converting circuits is an arbiter or a flip-flop.

10. The time-to-digital converter according to claim 9, wherein the flip-flop is a D flip-flop.

11. The time-to-digital converter according to claim 1, wherein a delay time of the first delayer in each stage of the N stages of converting circuits is not less than a delay time of the first delayer in the previous stage of the N stages of converting circuits.

12. The time-to-digital converter according to claim 1, wherein the reference signal is another clock signal.

13. The time-to-digital converter according to claim 1, wherein the binary number is thermometer code.

14. A digital phase locked loop, comprising a time-to-digital converter comprising:

N stages of the N stages of converting circuits connected in series, wherein N≥3, and N is an integer;

each stage of the converting circuits includes a first delayer and an arbiter, wherein a first delayer in a first stage of the N stages of converting circuits is configured to receive a reference signal, an input end of the first delayer in each stage of the N stages of converting circuits other than the first stage of the N stages of converting circuits is coupled to an output end of a first delayer in a previous stage of the N stages of converting circuits, and an output end of the first delayer in each stage of the N stages of converting circuits is configured to output a delayed signal of the stage of the N stages of converting circuits; and the arbiter in each stage of the N stages of converting circuits is configured to: receive a sampling clock of the stage of the N stages of converting circuits and the delayed signal of the stage of the N stages of converting circuits, and compare the sampling clock with the delayed signal to obtain an output signal of the stage of the N stages of converting circuits, wherein the sampling clock of each stage of the N stages of converting circuits is derived from a clock signal; and in the N stages of the N stages of converting circuits connected in series, a delay time of the first delayer in the first stage of the N stages of converting circuits is designed to be different than a delay time of a first delayer in at least one other stage of the N stages of converting circuits; and an output signal of the time-to-digital converter is a non-linear binary number formed by output signals of the N stages of the N stages of converting circuits, wherein the binary number is used to indicate a time difference between the clock signal and the reference signal, wherein the reference signal is a reference clock signal of the digital phase locked loop, and the clock signal is a frequency division signal of an output signal of the digital phase locked loop, wherein a delay time of the first delayer in the first stage of the N stages of converting circuits is a time unit; and a delay time of a first delayer in a $j^{th}$ converting circuit is $2^{j-2}$ time units, wherein j=3. . . N.

15. The digital phase locked loop according to claim 14, wherein the first delayer in each stage of the N stages of converting circuits comprises at least one first delay cell circuit; and quantities of first delay cell circuits comprised in first delayers in the at least two stages of the N stages of converting circuits are different.

16. The digital phase locked loop according to claim 14, wherein the sampling clock of each stage of the N stages of converting circuits is the clock signal.

17. The digital phase locked loop according to claim 14, wherein each stage of the N stages of converting circuits further comprises a second delayer, wherein a second delayer in the first stage of the N stages of converting circuits is configured to receive the clock signal, an input end of the second delayer in each stage of the N stages of converting circuits other than the first stage of the N stages of converting circuits is coupled to an output end of a second delayer in the previous stage of the N stages of converting circuits, and an output end of the second delayer in each stage of the N stages of converting circuits is configured to output the sampling clock of the stage of the N stages of converting circuits.

18. The digital phase locked loop according to claim 14, wherein a delay time of the first delayer in each stage of the N stages of converting circuits is not less than a delay time of the first delayer in the previous stage of the N stages of converting circuits.

* * * * *